(12) United States Patent
Hall

(10) Patent No.: US 10,986,753 B2
(45) Date of Patent: Apr. 20, 2021

(54) WATER-ASSISTED AIR COOLING FOR A ROW OF CABINET

(71) Applicant: International Business Machines Corporation, Armonk, NY (US)

(72) Inventor: Shawn A. Hall, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 131 days.

(21) Appl. No.: 15/647,854

(22) Filed: Jul. 12, 2017

(65) Prior Publication Data
US 2017/0311488 A1    Oct. 26, 2017

Related U.S. Application Data

(63) Continuation of application No. 13/764,034, filed on Feb. 11, 2013, now Pat. No. 9,723,760, which is a continuation of application No. 12/483,542, filed on Jun. 12, 2009, which is a continuation-in-part of application No. 11/939,165, filed on Nov. 13, 2007.

(51) Int. Cl.
H05K 7/20    (2006.01)

(52) U.S. Cl.
CPC .............. H05K 7/202 (2013.01); H05K 7/20 (2013.01); H05K 7/20136 (2013.01); H05K 7/20736 (2013.01); H05K 7/20745 (2013.01)

(58) Field of Classification Search
CPC ........... H05K 7/20736; H05K 7/20554; H05K 7/20572; H05K 7/20609; H05K 7/20; H05K 7/202; H05K 7/20136; H05K 7/20145; H05K 7/20218; H05K 7/20536; H05K 7/20563; H05K 7/206; H05K 7/20627; H05K 7/20645; H05K 7/20654; H05K 7/20709; H05K 7/20718; H05K 7/20727; H05K 7/20745; H05K 7/20754; H05K 7/2079; H05K 7/20763
See application file for complete search history.

(56) References Cited

U.S. PATENT DOCUMENTS

| | | |
|---|---|---|
| 3,167,113 A | 1/1965 | Kleiss |
| 3,172,462 A | 3/1965 | Brunner |
| 3,213,929 A | 10/1965 | Marshall et al. |
| 3,749,981 A | 7/1973 | Koltuniak et al. |

(Continued)

Primary Examiner — Jianying C Atkisson
Assistant Examiner — Miguel A Diaz
(74) Attorney, Agent, or Firm — Scully, Scott, Murphy & Presser, P.C.; Daniel P. Morris

(57) ABSTRACT

A cooling apparatus and method including a plurality of heat-producing devices positioned in a plurality of cabinets arranged in a row that allows flow of a first fluid through the heat-producing devices and cabinets where the flow is directed from an upstream end of the row to a downstream end of the row. The cabinets have a space therebetween wherein a heat exchanger is positioned between and adjacent to the cabinets, thereby the cabinets and heat exchangers alternate in the row. Each heat exchanger allows flow of a second fluid therethrough for cooling the first fluid. A fluid-moving device is positioned adjacent the heat-producing devices for encouraging flow of the first fluid through the cabinets' heat-producing devices and through the heat exchangers, thereby encouraging heat transfer in each of the heat exchangers from the first fluid to the second fluid.

20 Claims, 9 Drawing Sheets

(56) References Cited

U.S. PATENT DOCUMENTS

| | | |
|---|---|---|
| 3,820,590 A | 6/1974 | Littman et al. |
| 4,574,870 A | 3/1986 | Weitman |
| 4,729,424 A | 3/1988 | Mizuno et al. |
| 5,144,531 A | 9/1992 | Go et al. |
| 5,285,347 A | 2/1994 | Fox et al. |
| 5,345,779 A * | 9/1994 | Feeney .............. E04F 15/02411 361/695 |
| 5,419,146 A | 5/1995 | Sibik et al. |
| 5,467,609 A * | 11/1995 | Feeney .............. E04F 15/02411 52/220.2 |
| 5,644,248 A | 7/1997 | Fujimoto |
| 5,767,690 A | 6/1998 | Fujimoto |
| 5,978,218 A | 11/1999 | Fujimoto et al. |
| 6,222,729 B1 | 4/2001 | Yoshikawa |
| 6,305,180 B1 * | 10/2001 | Miller ................ H05K 7/20572 165/104.33 |
| 6,327,143 B1 | 12/2001 | Bonstrom et al. |
| 6,415,619 B1 | 7/2002 | Bash et al. |
| 6,819,563 B1 | 11/2004 | Chu et al. |
| 7,085,133 B2 | 8/2006 | Hall |
| 7,170,745 B2 | 1/2007 | Bash et al. |
| 7,342,789 B2 | 3/2008 | Hall et al. |
| 7,365,973 B2 | 4/2008 | Rasmussen et al. |
| 7,367,384 B2 | 5/2008 | Madara et al. |
| 7,477,514 B2 | 1/2009 | Campbell et al. |
| 7,486,513 B2 | 2/2009 | Hall et al. |
| 7,492,593 B2 | 2/2009 | Campbell et al. |
| 7,647,787 B2 * | 1/2010 | Belady ..................... F24F 3/06 62/259.2 |
| 7,724,513 B2 * | 5/2010 | Coglitore ........... H05K 7/20745 165/104.33 |
| 7,854,652 B2 | 12/2010 | Yates et al. |
| 8,659,895 B1 | 2/2014 | Carlson et al. |
| 8,672,732 B2 * | 3/2014 | Rasmussen .......... H05K 7/2079 454/184 |
| 10,130,011 B2 * | 11/2018 | Guering ............. H05K 7/20572 |
| 2004/0100779 A1 | 5/2004 | Chu et al. |
| 2005/0022967 A1 * | 2/2005 | Hall ................... H05K 7/20572 165/80.2 |
| 2005/0061013 A1 | 3/2005 | Bond |
| 2005/0235671 A1 * | 10/2005 | Belady ...................... F24F 3/06 62/259.2 |
| 2006/0065000 A1 * | 3/2006 | Belady ..................... F24F 3/06 62/259.2 |
| 2008/0029250 A1 | 2/2008 | Carlson et al. |
| 2008/0062647 A1 | 3/2008 | Hillis et al. |
| 2009/0122483 A1 | 5/2009 | Hall |
| 2009/0241578 A1 * | 10/2009 | Carlson ................... F25D 17/06 62/259.2 |
| 2010/0275618 A1 | 11/2010 | Beitelmal et al. |
| 2013/0149954 A1 * | 6/2013 | North ................... H05K 5/0213 454/184 |
| 2015/0230364 A1 * | 8/2015 | Wands ............... H05K 7/20145 454/184 |
| 2017/0325354 A1 * | 11/2017 | Lee ...................... H05K 5/0213 |
| 2018/0042141 A1 * | 2/2018 | Qu ......................... H05K 7/1489 |
| 2018/0077822 A1 * | 3/2018 | Sloan ........................ H05K 7/20 |
| 2018/0235106 A1 * | 8/2018 | Curtis ................ H05K 7/20145 |
| 2019/0141860 A1 * | 5/2019 | Tseng ................... H05K 7/1492 |

* cited by examiner

FIG. 1 -- Prior Art --

WATER-ASSISTED AIR COOLING FOR A ROW OF CABINET

CROSS-REFERENCE TO RELATED APPLICATION

This application is a continuation of patent application Ser. No. 13/764,034, filed Feb. 11, 2013, which is a continuation of patent application Ser. No. 12/483,542, filed Jun. 12, 2009, which is a continuation-in-part of patent application Ser. No. 11/939,165, filed Nov. 13, 2007, now abandoned. The entire contents and disclosures of U.S. patent application Ser. Nos. 13/764,034, 12/483,542 and 11/939,165 are hereby incorporated herein by reference in their entireties.

FIELD OF THE INVENTION

The present invention is related to devices and methods for cooling heat-producing equipment, and more specifically, is related to devices for cooling heat-producing electronic equipment arranged in a row of cabinets.

BACKGROUND OF THE INVENTION

Referring to FIG. 1 and the Cartesian coordinate system which comprises an x axis 102, a y axis 104, and a z axis 106 that are mutually orthogonal, a known air-cooling apparatus 100, described in U.S. Pat. No. 7,085,133, which is incorporated by reference herein in its entirety, includes a row of cabinets 108, including cabinets 110, 112, 114, 116 arrayed along the x axis 102. The row of cabinets 108 includes a first cabinet 110 located at the +x end of the row and a last cabinet 116 located at the −x end of the row. An arbitrary number of additional interior cabinets, such as cabinets 112 and 114 shown in FIG. 1, are positioned between the first cabinet 110 and the last cabinet 116.

An intake end-plenum 118, which includes a sloping wall 120, abuts the row of cabinets 108 at an upstream face 110a of the first cabinet 110 to direct cooled air thereto. An exhaust end-plenum 122, which includes a sloping wall 124, is adjacent to a downstream face 116b of the last cabinet 116 to direct exhaust air therefrom. Interposed between each pair of adjacent cabinets is a combined-plenum unit 126 that comprises both an intake plenum 128 and an exhaust plenum 130. Within each combined-plenum unit 126, the intake plenum 128 and the exhaust plenum 130 are separated from each other by a sloping wall 132. The combined plenum units 126 are mounted to the cabinets 110, 112, and 114 such that the exhaust plenums 130 thereof abut the cabinets' downstream surfaces 110b, 112b, and 114b respectively, and the intake plenums 128 thereof abut the cabinets' upstream surfaces 112a, 114a, and 116a, respectively. Each cabinet 110, 112, 114, 116 contains heat-producing electronics 134 arranged to allow airflow parallel to the x direction 102. Therefore, air-moving devices 136 in each cabinet are arranged to induce and encourage an S-shaped airflow 138. This type of cooling means is used, for example, in IBM®'s Bluegene®/L and Bluegene®/P supercomputers. The abutted row 108 of cabinets 110, 112, 114, 116 and plenums 118, 122, 126 stand in a room 140 on a raised floor 142 that is above and substantially parallel to a sub-floor 144. The raised floor 142 typically comprises a regular two-dimensional array of removable tiles 146 having pitch p in the x 102 and y 104 directions. Cooling air 148 is supplied to an under-floor space 150 between the raised floor 142 and the sub-floor 144 by a plurality of air-conditioning units 152 that are also known in the art.

Cooling one of the interior cabinets 112, 114 is accomplished by the S-shaped air-stream 138 passing through a hole 154 in the raised floor, and thereafter through the intake plenum 128. Drawn by the air-moving devices 136, the S-shaped air stream 138 travels over the heat-producing electronics 134, exiting the cabinet through the exhaust plenum 130. After the S-shaped air-stream 138 exits the exhaust plenum 130, it is returned to an open top surface 156 of the air conditioning units 152. Cooling of the first cabinet 110 or last cabinet 116 is similar to that for interior cabinets 114, except that the air enters the first cabinet 110 through the intake end plenum 118, and air exits the last cabinet 116 through the exhaust end plenum 122.

The known cooling apparatus 100 is deficient because it imposes at least the following several requirements on the room 140 and on the design of the cabinets 110, 112, 114, 116. First, each cabinet must be fed by an airflow rate V sufficient to keep all the cabinet's internal electronics 134 sufficiently cool. For cabinets that dissipate large quantities of heat, this requirement is often burdensome on the infrastructure of the room 140 because it requires significant investment in air-conditioning units 152, a large under-floor space 150, and a disruption of airflow patterns to other, already-existing equipment in the room.

Second, at the interface between any of the intake plenums 118, 128 and the abutting cabinets 110, 112, 114, 116 where the air-stream 138 first turns, the flow must be managed carefully, with appropriately designed turning aids, to avoid stagnation regions causing the electronics 134 to reach higher temperatures. This requirement is difficult to achieve in designing the cabinet, and despite best design efforts may be defeated by unusual raised-floor conditions, such as those where the distance between the raised floor 142 and the sub-floor 144 is too small, or where the hole 154 is partially obstructed by either structural members of the raised floor 142 or by equipment such as wires in under-floor space 150.

Third, in order to achieve high packing density of cabinets, the combined plenum unit 126 must be narrow. Thus, air must flow vertically through a relatively narrow intake plenum 128 and exhaust plenum 130. This requirement inevitably incurs pressure loss, leading to reduced flow rate V and increased temperature of the electronics 134.

Fourth, holes 154 must be cut in the raised floor 142 underneath each of the intake plenums 118 and 128. To avoid non-uniform flow leading to hotspots in the cabinet, the holes 154 must not be obstructed by structural members supporting the raised floor. Unobstructed holes are difficult to insure for all installations, because raised-floors are not standard worldwide, for example, the pitch p of the removable tiles 146 may differ from country to country.

Therefore, a need exists for an improved cooling apparatus and method of cooling a row of cabinets 108 that houses electronic equipment 134. It would be desirable, without sacrificing airflow through any particular item of the electronics 134, for the cooling apparatus to operate with the least possible total airflow, thereby minimizing both the cost of air-conditioning equipment 152 and the level of acoustical noise in the room 140. Further, it would be desirable to minimize constricted air passageways, such as the narrow plenums 128 and 130, that unduly limit airflow. Moreover, it would be desirable to avoid turns in the airflow path, such as those in the S-shaped airflow path 138, thereby to eliminate hotspots caused by flow non-uniformities and boundary-layer separation. Finally, it would be desirable to improve cabinet-packing density by minimizing the amount of space devoted exclusively to air handling, such as that occupied by plenums 118, 122, and 126.

SUMMARY OF THE INVENTION

In an aspect of the invention, a cooling apparatus includes a plurality of heat-producing devices positioned in a plurality of cabinets arranged in a row allowing flow of a first fluid through the heat-producing devices and cabinets. The flow of the first fluid is directed from an upstream end of the row to a downstream end of the row such that an upstream heat-exchanger side abuts a downstream cabinet side the cabinets positioned in spaced relation to each other and defining a space therebetween. A plurality of heat exchangers are positioned at least partially in the spaces between the cabinets and adjacent to the cabinets. Thereby the cabinets and the heat exchangers alternate in the rows, each heat exchanger allowing flow of a second fluid therethrough for cooling the first fluid. At least one fluid-moving device positioned adjacent the heat-producing devices for encouraging the flow of the first fluid through the cabinets' heat-producing devices and through the heat exchangers, thereby encouraging the transfer of heat from the first fluid to the second fluid in the heat exchangers.

In a related aspect, at least one fluid-moving device is positioned between the heat-producing devices of each cabinet and the heat exchanger immediately downstream of the heat-producing device.

In a related aspect, the apparatus further includes a first fluid-moving device positioned between the heat-producing device and the heat exchanger, and a second fluid-moving device is positioned between the heat exchanger and the cabinet immediately downstream of the heat exchanger.

In a related aspect, the apparatus further includes a plurality of first fluid-moving devices positioned between the heat-producing devices and a plurality of heat exchangers, and a plurality of second fluid-moving devices each positioned between the heat exchangers and a front of the plurality of cabinets. In an embodiment of the apparatus, the first fluid may be air. Further, the heat-producing devices may be electronic devices, and further may be heat-producing devices such as computers or computer processors.

In a related aspect, a plenum is positioned at an upstream side of a first cabinet of the plurality of cabinets for directing incoming ambient air.

In a related aspect, a first plenum is positioned at an upstream side of a first cabinet of the plurality of cabinets for guiding the direction of incoming ambient air, and a second plenum is positioned at a downstream side of a last cabinet of the plurality of cabinets for guiding the direction of outgoing ambient air.

In a related aspect, the second fluid is water. In another embodiment of the invention, the heat exchanger includes ingress and egress tubes carrying the second fluid, to remove heat from the first fluid. In another embodiment, the flow of the first fluid is directed in a closed loop.

In a related aspect, the apparatus further includes a plurality of fluid-moving devices positioned adjacent an upstream side and a downstream side of the heat-producing devices for encouraging flow of the first fluid through the cabinets' heat-producing devices and through the heat exchangers.

In a related aspect, the apparatus further includes a vertical barrier dividing the cabinets into a front portion and a rear portion, and circulating the first fluid in a closed loop between the front and rear portions. Additionally, the apparatus may include a horizontal barrier dividing the cabinets into an upper portion and a lower portion, and circulating the first fluid in a closed loop between the upper and lower portions.

In another aspect of the invention, a cooling system in an enclosed room includes a plurality of heat-producing devices positioned in a plurality of cabinets arranged in a row allowing a flow of a first fluid through the heat-producing devices and cabinets. The flow of the first fluid is directed from an upstream end of the row to a downstream end of the row, and the cabinets are positioned in spaced relation to each other and define a space therebetween. A plurality of heat exchangers are positioned at least partially in the spaces between the cabinets and adjacent to the cabinets. Thereby, the cabinets and the heat exchangers alternate in the rows such that an upstream heat-exchanger side abuts a downstream cabinet side, and each heat exchanger allows flow of a second fluid therethrough for cooling the first fluid. At least one fluid-moving device is positioned adjacent the heat-producing devices for encouraging the flow of the first fluid through the cabinets' heat-producing devices and through the heat exchangers, thereby encouraging in each of the heat exchangers a transfer of heat from the first fluid to the second fluid. A first plenum adjacent an upstream side of a first cabinet for directing the flow of the first fluid as it enters the row of cabinets. A last plenum adjacent a downstream side of a last cabinet for directing the flow of the first fluid exiting the row of cabinets.

In a related aspect, the first fluid is cycled in a closed loop within the enclosed room. In an alternative embodiment, the system further comprises a raised floor in the enclosed room, wherein the raised floor supports the plurality of cabinets, and the first fluid is directed through holes in the raised floor. In a further aspect, each of the heat exchangers provide, at its downstream side, a temperature of the first fluid that is substantially the same as the temperature of the first fluid when entering the upstream side of the first cabinet.

In another aspect, a method for cooling includes: (a) positioning a plurality of heat-producing devices in a plurality of cabinets arranged in a row; (b) positioning a plurality of heat exchangers in a space between the cabinets and adjacent to the cabinets, thereby alternating the cabinets and the heat exchangers in the row; (c) directing flow of a first fluid through the heat-producing devices, cabinets, and heat exchangers for cooling the first fluid; and (d) positioning a plurality of fluid-moving devices adjacent the heat-producing devices for encouraging flow of the first fluid through the cabinets' heat-producing devices and through the heat exchangers, thereby encouraging heat transfer from the first fluid to a second fluid in each of the heat exchangers.

BRIEF DESCRIPTION OF THE DRAWINGS

These and other objects, features and advantages of the present invention will become apparent from the following detailed description of illustrative embodiments thereof, which is to be read in connection with the accompanying drawings, in which.

DETAILED DESCRIPTION OF THE INVENTION

Figure 1:
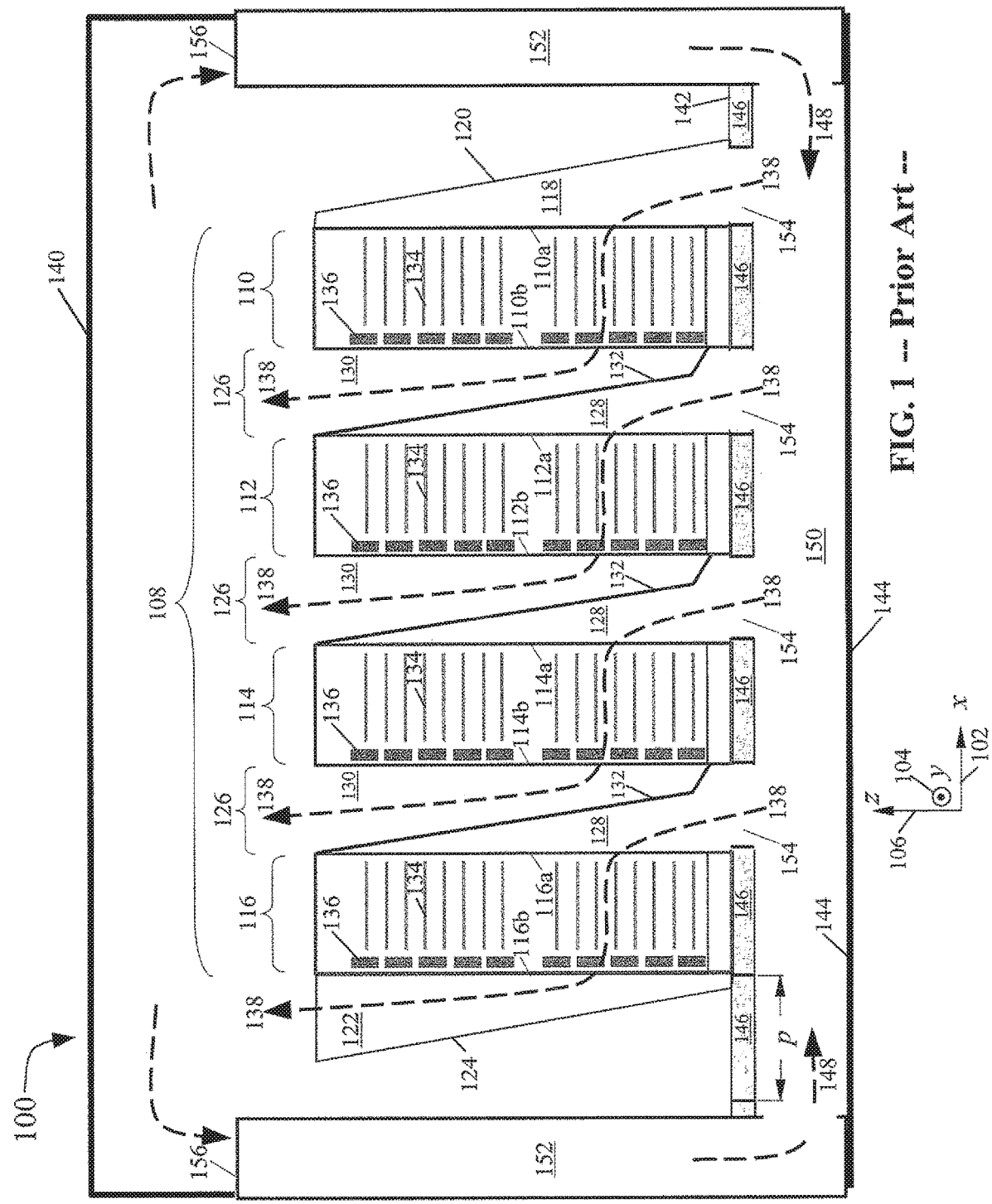
FIG. 1 is a front elevational view of a prior art cooling apparatus depicting a row of cabinets with interleaved airflow plenums.
Figure 2:
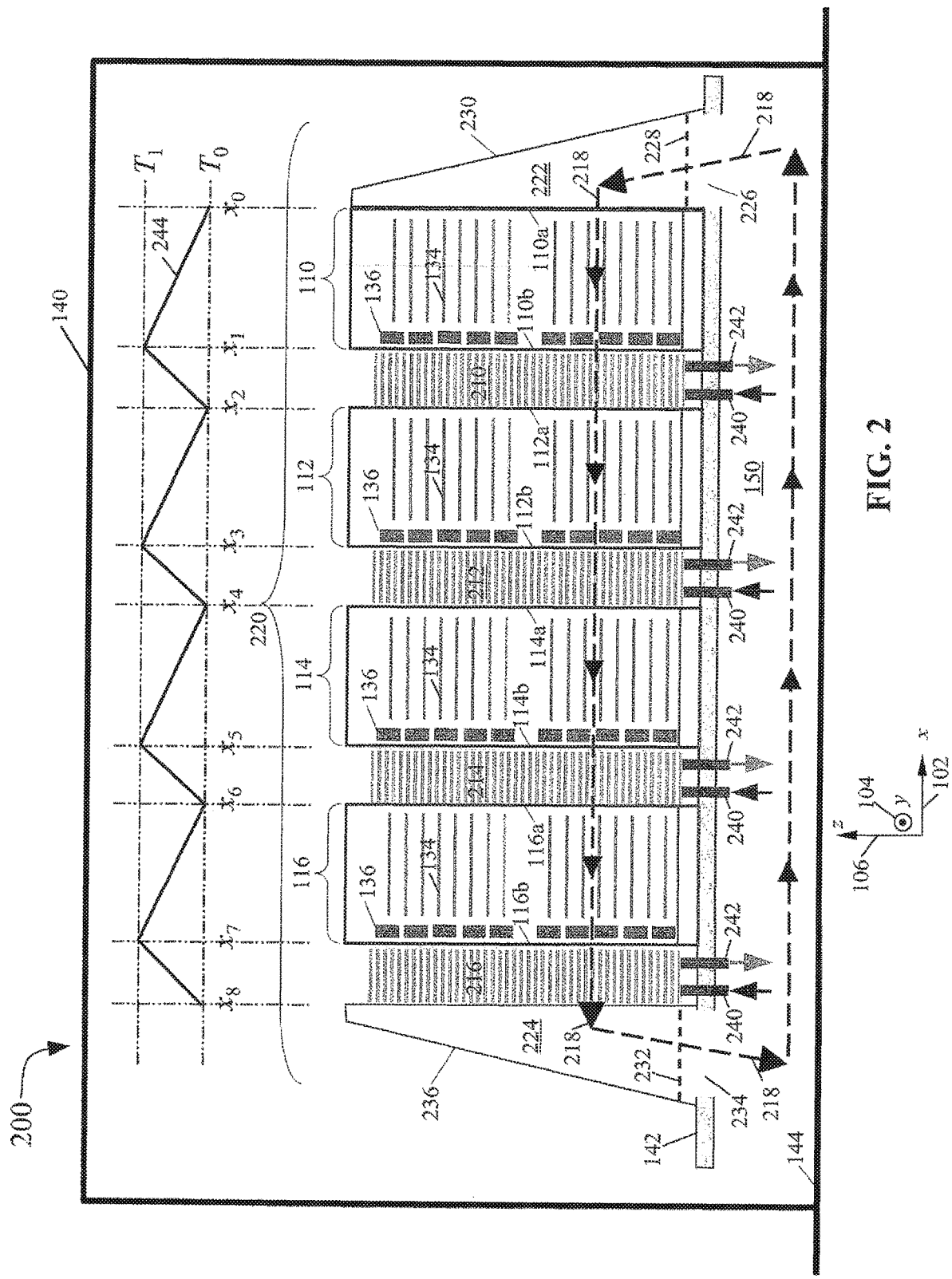
FIG. 2 is a front elevational view of a cooling apparatus according to an embodiment of the present invention depicting heat exchangers between cabinets in a row.

Referring to FIG. 2, an illustrative embodiment of a cooling apparatus 200 according to the present invention uses the same reference numerals for like elements as the prior art apparatus 100 shown in FIG. 1. However, the apparatus 200 differs from the prior art apparatus 100 in at least two significant ways. First, on the downstream faces of each cabinet 110, 112, 114, 116, the present invention employs, in contrast to the prior art air plenums 126, 122, a series of air-to-water heat exchangers 210, 212, 214, 216. Second, the present invention uses, in place of the prior art's multiple S-shaped air paths 138, a single, row-wise airflow path 218 that travels substantially in the −x direction, straight through an entire flow-through row 220. The flow-through row 220 comprises the cabinets 110, 112, 114, 116; the heat exchangers 210, 212, 214, 216, and optionally an intake plenum and an exhaust plenum such as a bottom-intake plenum 222, and a bottom-exhaust plenum 224, respectively.

The heat exchangers 210, 212, 214, 216 make possible the row-wise airflow path 218. Referring to the graph 244 of air temperature vs. horizontal coordinate x at the top of FIG. 2, the heat-producing electronics in cabinet 110 cause the temperature of the air circulating along air path 218 to rise from $T_0$ to $T_1$ as it traverses cabinet 110 from the cabinet's upstream face 110a at $x=x_0$ to the downstream face 110b at $x=x_1$. The air-to-water heat exchanger 210 is typically a tube-and-fin heat exchanger well known in the art, wherein warm air passes over the heat-exchanger's fins and a cold liquid flows in the heat exchanger's tubes, thereby allowing heat to be transferred from the air to the liquid. The liquid is supplied to each heat exchanger from an external liquid-chilling system via a supply pipe 240, and is returned to the liquid-chilling system via a return pipe 242. Therefore, in traversing the heat exchanger 210 from $x_1$ to $x_2$, the temperature of the air, being cooled by the externally chilled liquid, drops from $T_1$ to $T_0$. Thus, the combination of cabinet 110 and heat exchanger 210 is thermally neutral for the air. This air-temperature cycle is repeated for subsequent cabinets and heat exchangers: the air is warmed to temperature $T_1$ a second time while traversing cabinet 112 in the region $x_2$ to $x_3$, is cooled a second time to temperature $T_0$ by the heat exchanger 212 in the region $x_3$ to $x_4$, is warmed a third time to temperature $T_1$ while traversing cabinet 114 in the region $x_4$ to $x_5$, is cooled a third time to temperature $T_0$ by heat exchanger 214 in the region $x_5$ to $x_6$, is warmed a fourth time to temperature $T_1$ by cabinet 116 in the region $x_6$ to $x_7$, and is finally cooled a fourth time to temperature $T_0$ by heat exchanger 216 in the region $x_7$ to $x_8$. Thus, the entire flow-through row 220 is thermally neutral for the air; that is, the air returns to the under-floor space 150 at temperature $T_0$, ready to repeat the cycle. Because the air path 218 is closed, the temperatures $T_0$ and $T_1$ will automatically float to whatever values cause equilibrium to occur. Thus, it is necessary to choose heat exchangers 210, 212, 214, 216 and air-moving devices 136 such that acceptable temperatures are obtained for the worst-case heat dissipation of electronics 134. Heat exchanges 210, 212, 214, 216 are described in U.S. patent application Ser. No. 11/939,165, filed Nov. 13, 2007, now abandoned, the disclosure of which is hereby incorporated herein by reference in its entirety. Temperature control of a cooling fluid is also discussed in copending U.S. patent application Ser. No. 12/483,542, filed Jun. 12, 2009, the disclosure of which is hereby incorporated herein by reference in its entirety.

Again referring to FIG. 2, the row-wise airflow path 218 is now described in detail. Air enters the first cabinet 110 from the under-floor space 150, flowing upward through row-intake hole 226 in the raised-floor 142, and through the perforated metal screen 228, which may be necessary, depending on the nature of the electronics, to prevent the escape of electromagnetic radiation therefrom into the room 140. The row-wise airflow path 218 moves upward through the bottom-intake plenum 222 to the first cabinet 110 of the flow-through row 220. The air-moving devices 136 within the cabinets 110, 112, 114, 116 encourage the row-wise airflow path 218 through each cabinet 110, 112, 114, 116, and thereby through the entire flow-through row 220. An intake-end wall 230 of the bottom-intake plenum 222 may, if desired, slant inward toward the top of the first cabinet 110, inasmuch as upper cross-sections of the intake plenum 222 handle far less airflow than lower cross-sections, and thus require less cross-sectional area. Alternatively, the intake-end wall 230 may be substantially vertical, or removed altogether. In the latter case, the flow-through row 220 draws air from the room 140 rather than from the under-floor space 150.

The row-wise airflow path 218 exits the last cabinet 116 of the flow-through row 220, flowing downward through a perforated-metal exhaust screen 232 whose function is similar to that of the perforated-metal intake screen 228, downward through a row-exhaust hole 234 in the raised-floor 142, and thereby into the under-floor space 150. An exhaust-end wall 236 of the bottom-exhaust end plenum 224 may, if desired, slant outward toward the bottom of the last cabinet 116, inasmuch as upper cross-sections of the bottom-exhaust plenum 224 handle far less airflow than lower cross-sections, and thus require less cross-sectional area. Alternatively, the exhaust-end wall 230 may be substantially vertical, or removed altogether. In the latter case, the flow-through row 220 exhausts air to the room 140 rather than to the under-floor space 150.

Figure 3:
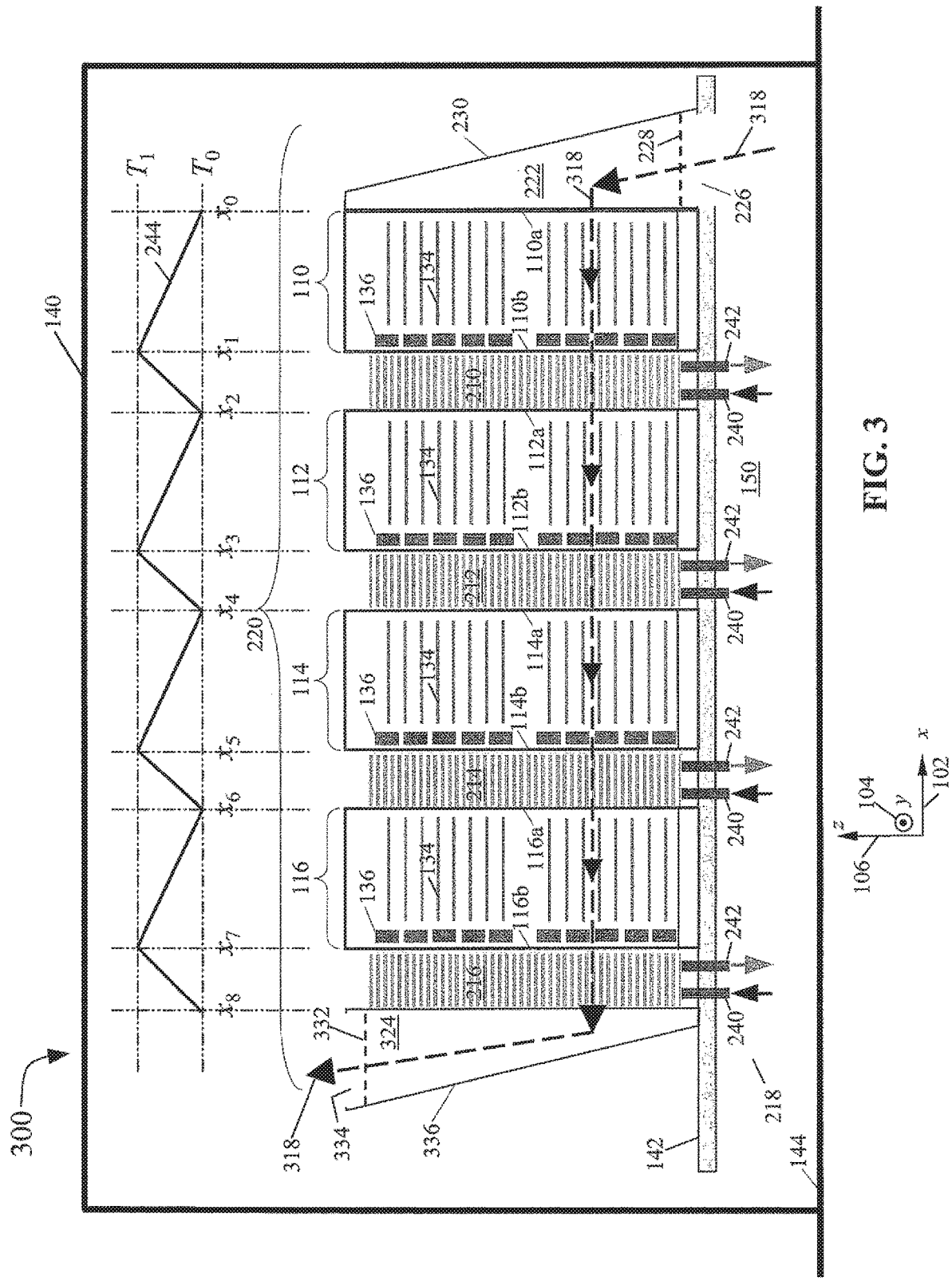
FIG. 3 is a front elevational view of an apparatus according to another embodiment of the invention depicting differently arranged plenums.

Referring to FIG. 3, another embodiment of the invention is a cooling apparatus 300 that includes a top-exhaust plenum 324 instead of the bottom-exhaust plenum 224 previously shown in FIG. 2. The top-exhaust plenum 324 is identical to bottom-exhaust plenum 224 except that it is rotated 180 degrees about the x axis, such that top-exhaust plenum 324 is wide at the top, by virtue of a sloping end wall 336, thereby to accommodate greater airflow at upper cross sections than at lower cross sections In the cooling apparatus 300, a row-wise airflow 318 behaves as in cooling apparatus 200, except that in apparatus 300, the airflow 318 exits the row 220 flowing upward through the top-exhaust end plenum 324, which has an opening 334 at the top. A perforated metal exhaust screen 332 at the top of top-exhaust plenum 324 serves the same purpose as screen 232 in plenum 224, as discussed previously. As with the apparatus 200 shown in FIG. 2, and also pertaining to the embodiments shown in FIGS. 4, 6 and 7, depending on the nature of the electronics 134, it may not be necessary to include the perforated metal screen 332 to prevent the escape of electromagnetic radiation from the flow-through row 220.

Figure 4:
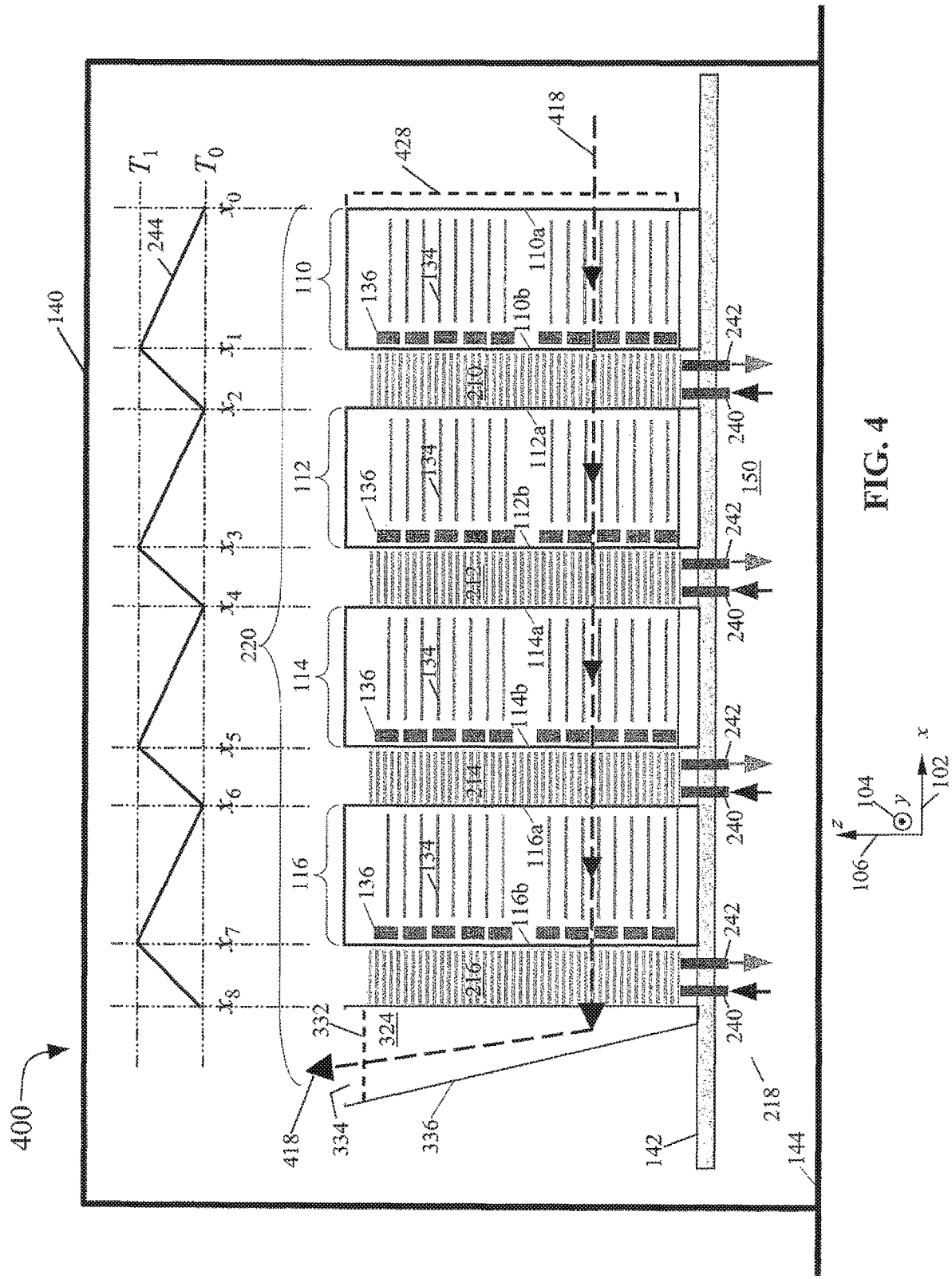
FIG. 4 is a front elevational view of an apparatus according to another embodiment of the invention without a plenum on the air-intake end of the row of cabinets.

Referring to FIG. 4, another alternative embodiment of the invention is a cooling apparatus 400, where no intake plenum is used. In this embodiment, airflow 418 enters the flow-through row of cabinets 220 directly from the room 140. The airflow exits the apparatus 400 as in the apparatus 300 shown in FIG. 3. Pertaining to this embodiment as well as to that shown on FIG. 5, to prevent the escape of electromagnetic radiation from the flow-through row 220, it may be necessary, depending on the nature of the electronics 134, to affix to the upstream surface 110a of the first cabinet 110 a perforated metal screen 428, through which air flows immediately prior to entering cabinet 110.

Figure 5:
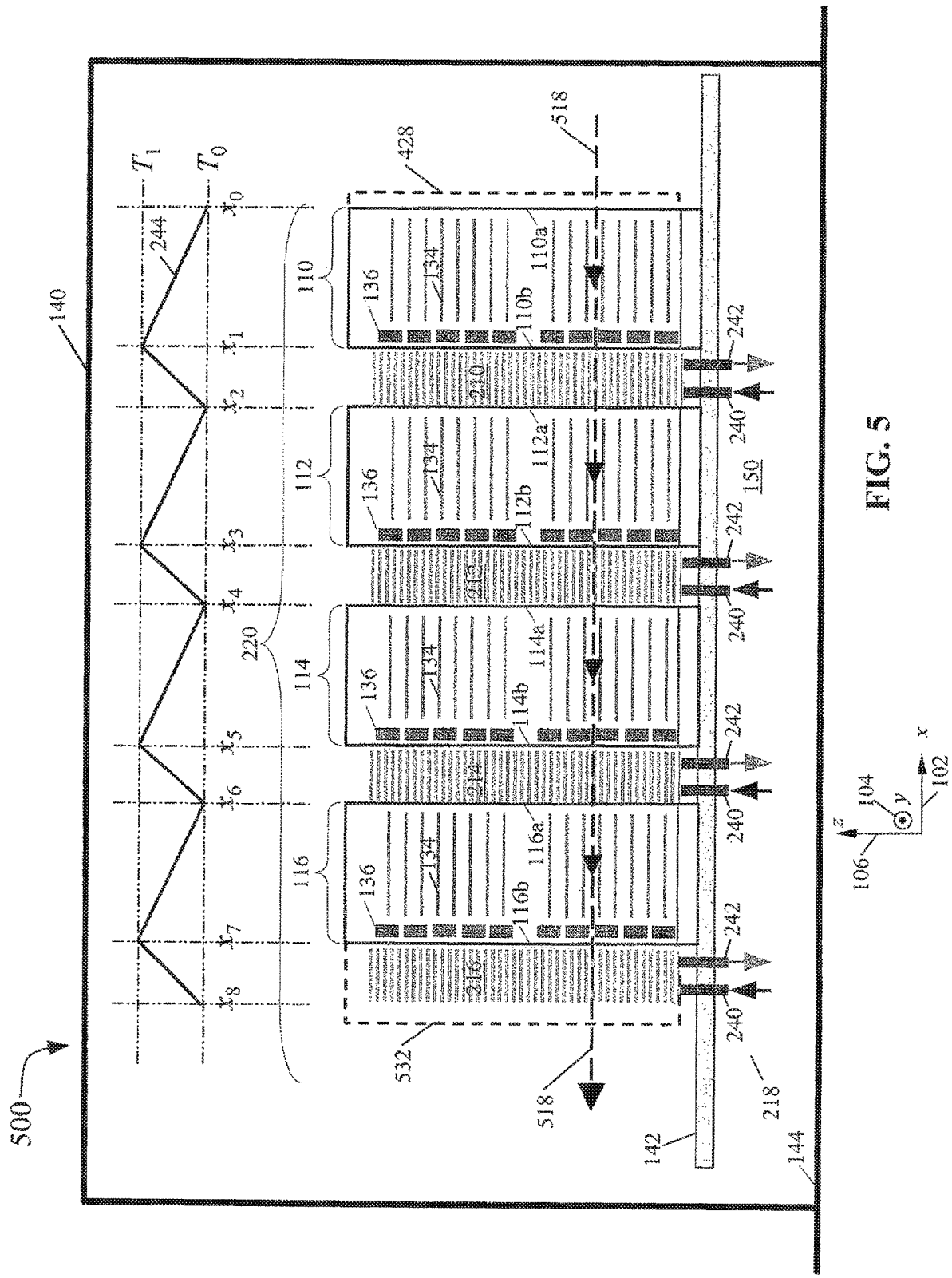
FIG. 5 is a front elevational view of an apparatus according to another embodiment of the invention without plenums at either the air-intake end or the air-exhaust end of the row of cabinets.

Referring to FIG. 5, another alternative embodiment of the invention is a cooling apparatus 500 where no intake-end plenum or exhaust-end plenum is used. In this embodiment, airflow 518 exhausts from the last cabinet 116 directly to the room 140. Airflow 518 is otherwise identical to airflow 418 discussed with reference to FIG. 4. To prevent the escape of electromagnetic radiation from the flow-through row 220, it may be necessary, depending on the nature of the electronics 134, to affix to the downstream surface 116b of the last cabinet 116 a perforated metal screen 532.

Figure 6:
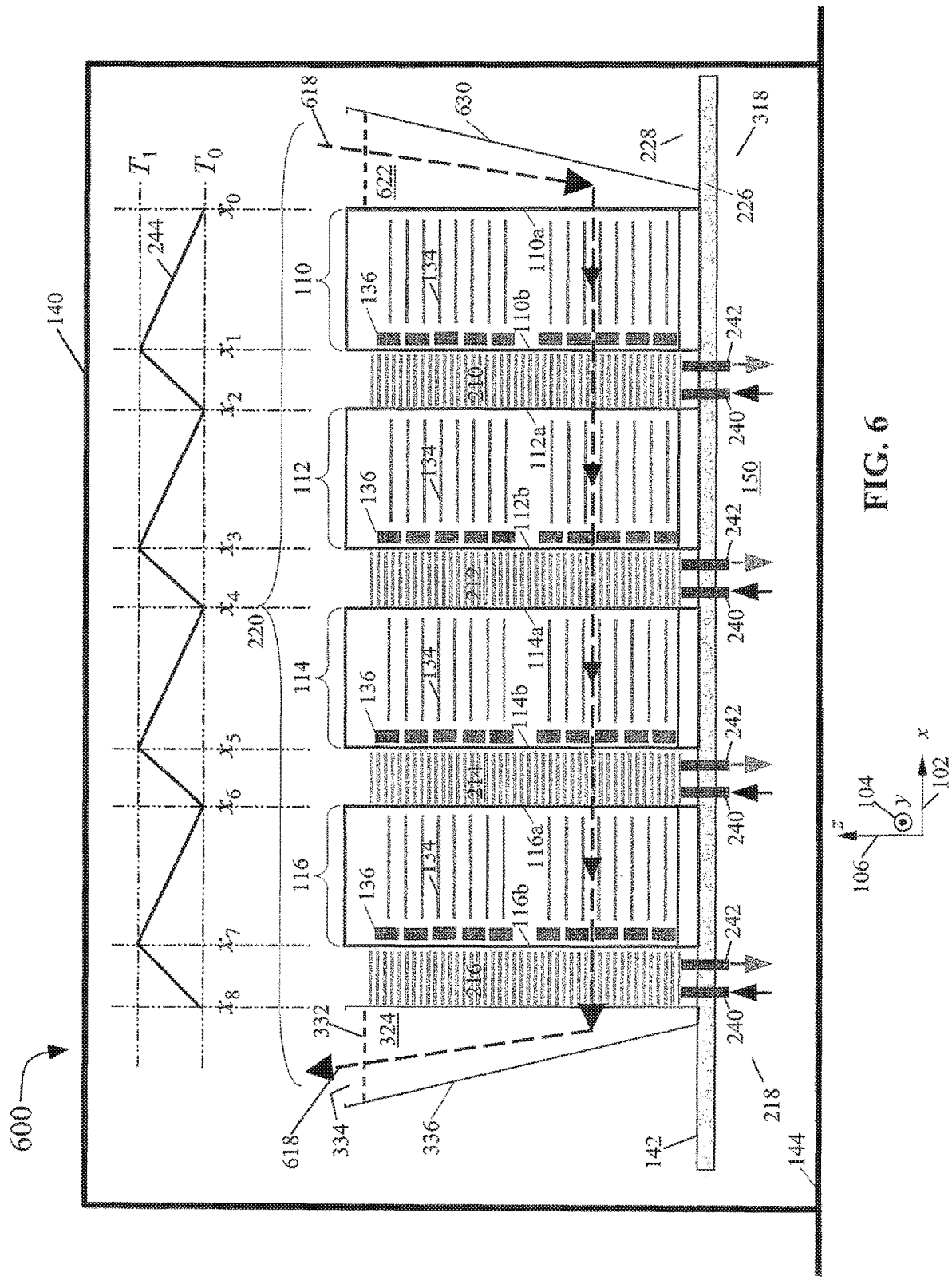
FIG. 6 is a front elevational view of an apparatus according to another embodiment of the invention depicting differently arranged plenums.

Referring to FIG. 6, another alternative embodiment of the invention is cooling apparatus 600, where a top-intake end plenum 622 and the top-exhaust end plenum 324 are used. The top-intake plenum 622 is identical to the bottom-intake plenum 222, shown in FIG. 2, except that it is rotated 180 degrees about the x axis, such that the top-intake plenum 622 is wide at the top, by virtue of a sloping end wall 630, thereby to accommodate greater airflow at upper cross sections than at lower cross sections. In this embodiment, an airflow 618 enters the flow-through row 220 downward through the top-intake end plenum 622 and exits the flow-through row 220 upward through the top-exhaust end plenum 324.

Figure 7:
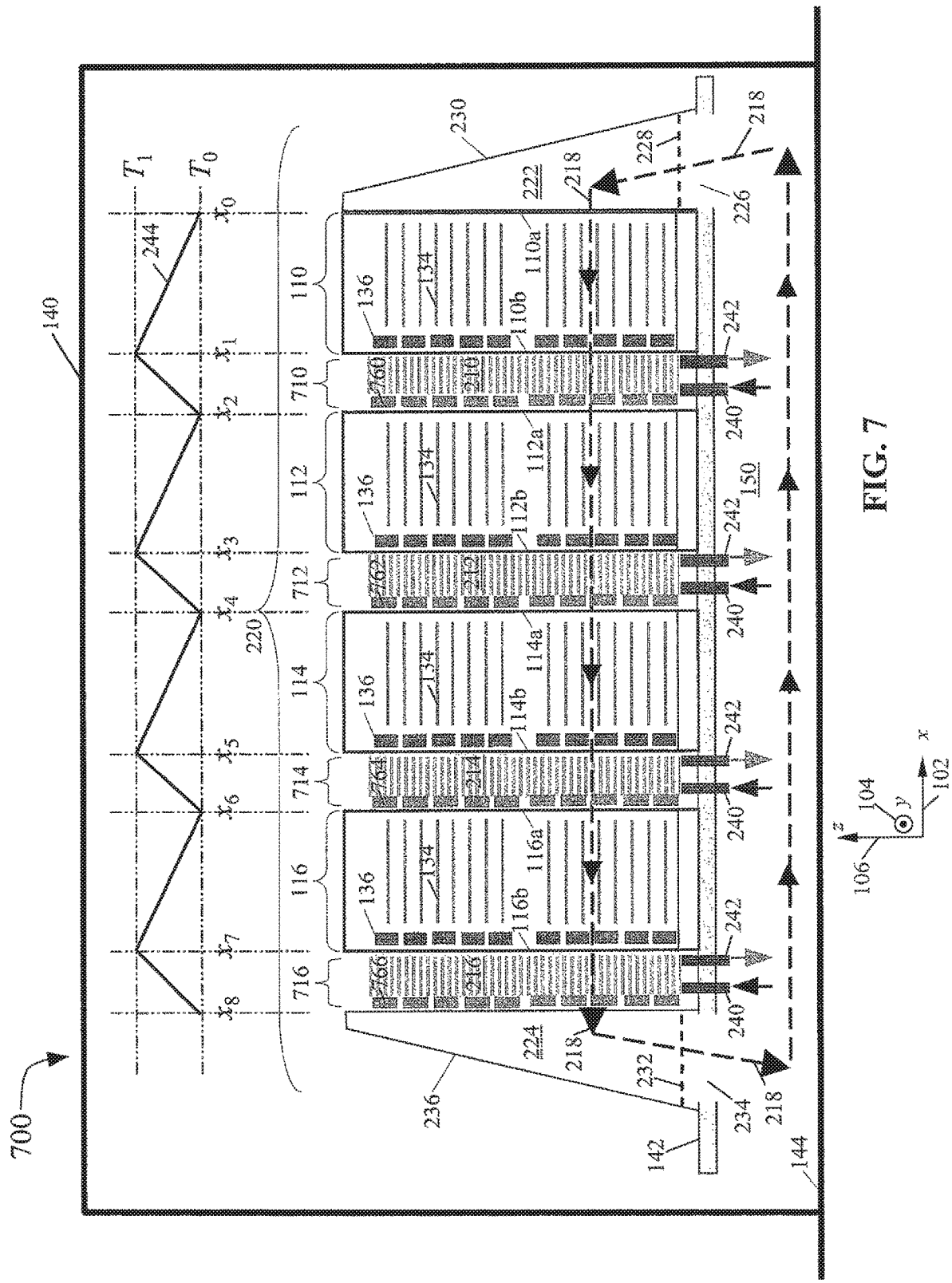
FIG. 7 is a front elevational view of an apparatus according to another embodiment of the invention depicting first and second air-moving devices.

Referring to FIG. 7, another embodiment of the invention is a cooling apparatus 700, which is similar to the apparatus 200 shown in FIG. 2. However, in the apparatus 700 shown in FIG. 7, the heat-exchanger 210 is replaced by a heat-exchanger assembly 710 that comprises, in addition to the heat exchanger 210, an array of air-moving devices 760, such as axial-flow fans. Likewise, the heat exchangers 212, 214, and 216 shown in FIG. 2 are replaced, in apparatus 700, by heat-exchanger assemblies 712, 714, 716 respectively, which comprise, in addition to heat exchangers 212, 214, and 216 respectively, air-moving devices 762, 764, and 766 respectively. Thus, the cooling apparatus 700 includes air-moving devices 760, 762, 764, 766 that supplement the air-moving devices 136 within the cabinets 110, 112, 114, 116. Alternatively, depending, for example, on the cost and pressure-rise requirements of the cooling system and on the space required by the electronics, the air-moving devices 760, 762, 764, 766 may replace the air-moving devices 136 contained within the cabinets 110, 112, 114, 116.

The heat-exchanger assemblies 710, 712, 714, 716, although described above for use with the airflow arrangement of the cooling apparatus 200 shown in FIG. 2, may also be used with any of the other airflow arrangements, as shown in cooling apparatuses 300, 400, 500, and 600 of FIGS. 3-6, respectively.

Figure 8:
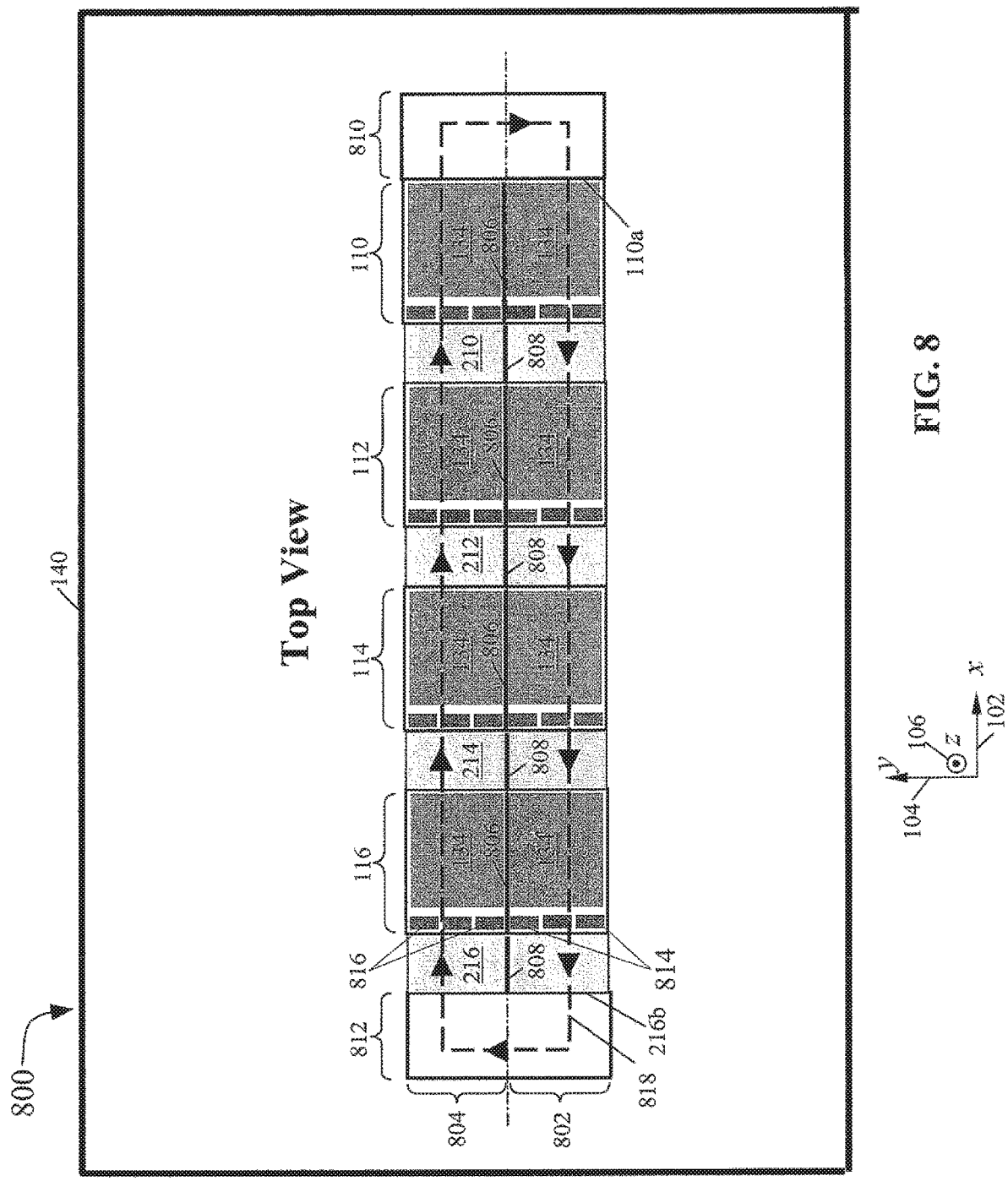
FIG. 8 is a plan view of an apparatus according to another embodiment of the invention depicting a vertical barrier for dividing the cabinets and heat exchangers into front and rear portons.

Referring to FIG. 8, another embodiment of the invention is a cooling apparatus 800, wherein each of the cabinets 110, 112, 114, 116 is internally divided into a front portion 802 and a rear portion 804. Note that FIG. 8 is a plan view, as specified by the orientation of the x, y, and z axes 102, 104, 106 respectively, whereas FIGS. 1-7 and 9 are front elevational views. In each cabinet, the portions 802, 804 are separated from each other by a vertical cabinet barrier 806 that substantially prevents air flow across it. The barrier 806 lies substantially parallel to an xz plane spanned by the x and z axes. Likewise, each of the heat-exchangers 210, 212, 214, 216 comprises, in this embodiment, a vertical heat-exchanger barrier 808 that substantially prevents airflow across it. The cabinet barriers 806 and the heat-exchanger barriers 808 are substantially co-planar. A first closed-end plenum 810 is abutted to the upstream face 110a of the first cabinet 110, and a second closed-end plenum 812 is abutted to a downstream face 216b of the heat exchanger 216. Front air-moving devices 814 in the front portion 802 of the cabinets 110, 112, 114, 116 are configured to drive a closed-horizontal-loop air-stream 818 in the –x direction, while rear air-moving devices 816 in the rear portion 804 of the cabinets 110, 112, 114, 116 are configured to drive the closed-horizontal-loop air stream 818 in the +x direction, such that the air stream 818 circulates in a closed loop about the vertical z axis 106. That is, the closed-horizontal-loop air-stream 818 flows toward +x in the rear portion 804 of the cabinets 100, 112, 114, 116 and heat exchangers 210, 212, 214, 216, then toward –y in the first closed-end plenum 810, then toward –x in the front portion 802 of the cabinets and heat exchangers, and finally toward +y in the second closed-end plenum 812, thus completing a closed loop. This closed-loop embodiment is advantageous because it imposes no air-handling burden on the room 140, and because it provides very quiet operation of the air moving devices 814, 816, particularly when the cabinets 110, 112, 114, 116, heat-exchanger assemblies 210, 212, 214, 216, and closed-end plenums 810, 812 are acoustically insulated, because people in the room 140 are shielded from the noise of air movers and flowing air.

Again referring to the apparatus 800 shown in FIG. 8, it should be noted that the closed-horizontal-loop air stream 818, at its +x end, traverses two sets of heat-producing electronics 134, in the rear portion 804 of the first cabinet 110 and in the front portion 802 of the first cabinet 110, without any intervening heat exchanger to cool the air. If this causes the air to become unacceptably warm in the front portion 802 of cabinet 110, so as to compromise cooling of the electronics 134 therein, then an additional heat exchanger identical to 210 may be abutted to the +x surface of the first cabinet 110.

Figure 9:
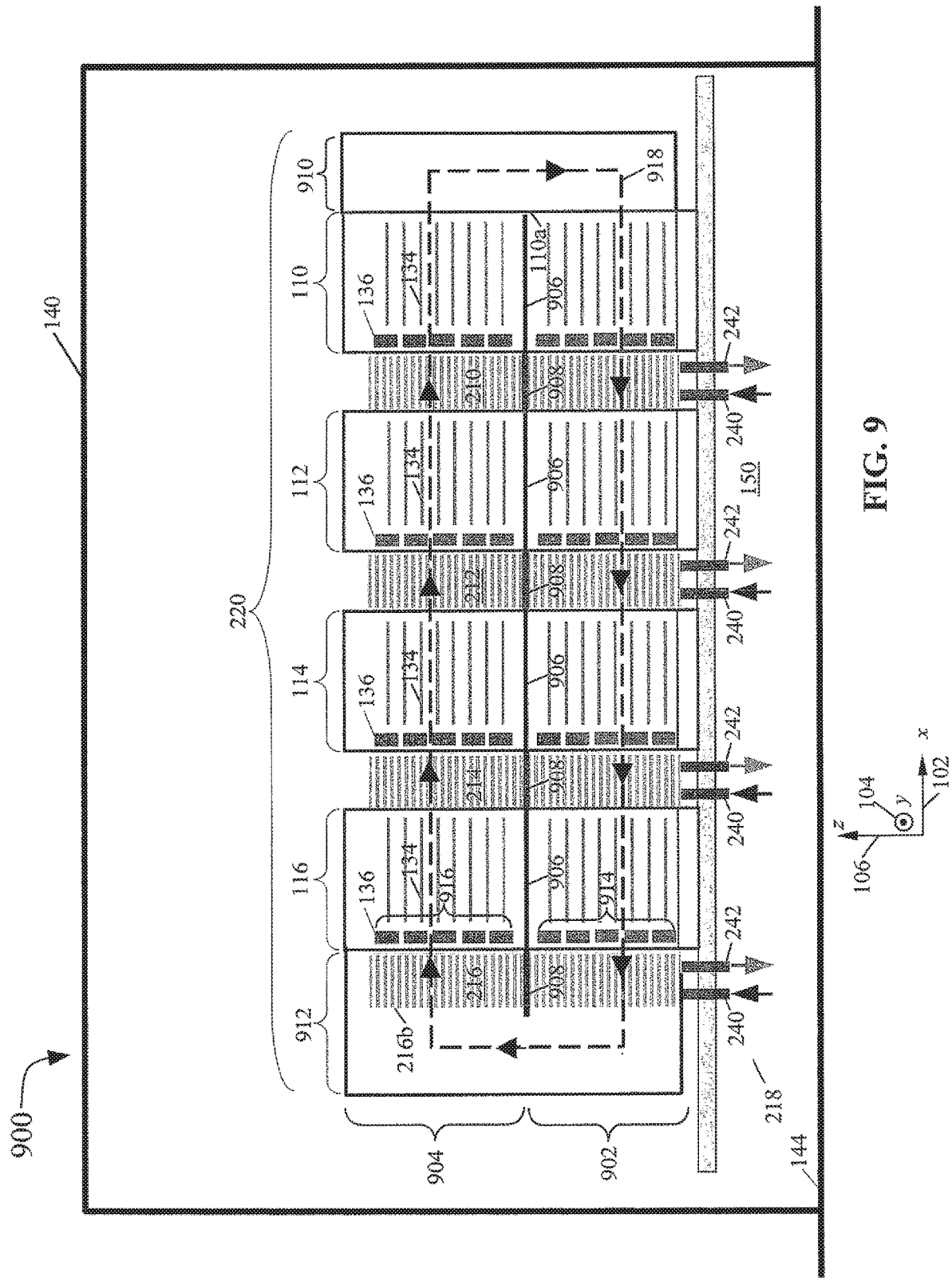
FIG. 9 is a front elevational view of an apparatus according to another embodiment of the invention depicting a horizontal barrier for dividing the cabinets and heat exchangers into upper and lower portions.

Referring to FIG. 9, another embodiment of the invention is a cooling apparatus 900, wherein each of the cabinets 110, 112, 114, 116 is internally divided into a lower portion 902 and an upper portion 904. In each cabinet, the portions 902, 904 are separated from each other by a horizontal cabinet barrier 906 that substantially prevents air flow across it. Barrier 906 lies substantially parallel to an xy plane spanned by the x and y axes. Likewise, each of the heat-exchangers 210, 212, 214, 216 comprises, in this embodiment, a horizontal heat-exchanger barrier 908 that substantially prevents air flow across it. The cabinet barriers 906 and the heat-exchanger barriers 908 are substantially co-planar. A first closed-end plenum 910 is abutted to the upstream face 110a of the first cabinet 110, and a second closed-end plenum 912 is abutted to a downstream face 216b of the heat exchanger 216. Lower air-moving devices 914 in the lower portion 902 of the cabinets 110, 112, 114, 116 are configured to drive a closed-vertical-loop air-stream 918 in the −x direction, while upper air-moving devices 916 in the upper portion 904 of the cabinets 110, 112, 114, 116 are configured to drive the closed-vertical-loop air stream 918 in the +x direction, such that the air stream 918 circulates in a closed loop about the horizontal y axis 104. More specifically, the closed-horizontal-loop air-stream 918 flows toward +x in the upper portion 904 of the cabinets 100, 112, 114, 116 and heat exchangers 210, 212, 214, 216, then toward −z in the first closed-end plenum 810, then toward −x in the lower portion 902 of the cabinets and heat exchangers, and finally toward +y in the second closed-end plenum 812, thus completing a closed loop. This closed-loop embodiment, shown in FIG. 9, is advantageous for the same acoustic reason described earlier in connection with apparatus 800 shown in FIG. 8.

Again referring to the apparatus 900 shown in FIG. 9, it should be noted that the closed-horizontal-loop air stream 918, at its +x end, traverses two sets of heat-producing electronics 134, in the upper portion 904 of the first cabinet 110 and in the lower portion 902 of the first cabinet 110, without any intervening heat exchanger to cool the air. If this causes the air to become unacceptably warm in the lower portion 902 of cabinet 110 so as to compromise cooling of the electronics 134 therein, then an additional heat exchanger identical to 210 may be abutted to the +x surface of the first cabinet 110.

Additionally, other embodiments and variations are possible keeping with the spirit and scope of the invention, for example, although the embodiments presented herein have included "air-to-water heat exchangers", the heat exchangers may use other fluids. In another example, the water supply and return pipes 240, 242 may enter the heat-exchangers 210, 212, 214, 216 from the top rather than from the bottom.

All the embodiments of the current invention, including those represented as cooling apparatuses 200, 300, 400, 500, 600, 700, 800, and 900, shown in FIGS. 2-9, respectively, have a number of significant advantages over the prior-art apparatus 100 shown in FIG. 1, including those discussed hereinafter. A first advantage is that the total airflow required in the room 140, and the associated acoustical noise, are greatly reduced by the invention vis-à-vis the prior art, leading to greater acoustical comfort for humans in the room 140, and to less disruption of airflow if the room houses an existing installation of other equipment. Quantitatively, if volumetric flow rate V of air is required to cool each cabinet, and there are N cabinets in a row, then the prior art requires a total flow rate of NV per row, whereas the present invention which requires only V per row. This is a factor of N improvement that allows installation of such cabinets in buildings unable to support large amounts of airflow, and also reduces the total amount of airflow noise.

Second, many fewer air-conditioning units 152 are required in the room 140 by the invention than by the prior art, leading to lower capital investment in air-conditioning units 152 and lower energy cost to drive air-moving devices therein. According to the invention, the heat load of electronics 134 is transferred from the air locally to water flowing in pipes 240, 242 of heat exchangers 210, 212, 214, 216. Therefore, the flow-through row 220 puts no thermal load on the room 140, and thus requires only minimal air-conditioning for general dehumidification, and ancillary heat loads. In contrast, the prior-art row 108 dissipates all its heat load to the room, thus requiring, if the number of cabinets and the power dissipation therein is large, a great number of air-conditioning units 152.

Third, the prior-art's narrow airflow plenums 126, shown in FIG. 1, are eliminated. Such narrow plenums are required by the prior art to achieve compact packaging along the flow-through row 220, and to insure that the holes 154 in the raised floor 142 match the periodicity p of the raised-floor tiles 146. However, air velocity is high in the narrow airflow plenums 126, typically much larger than in the cabinet itself, because the cross-sectional area normal to the airstream is much smaller in the plenum than in the cabinet. Thus pressure drop in the airflow plenums 126 is large, and airflow rate through the prior-art electronics 134 is thereby restricted, increasing the temperature therein and reducing the lifetime and performance thereof. In the invention, this source of pressure drop is eliminated. Some pressure loss occurs in the invention's heat exchangers 210, 212, 214, 216, but because the cross-sectional area of the heat exchanger is large, air velocity is low, and therefore pressure drop is relatively small.

Fourth, flow non-uniformities that occur in the prior art are eliminated. Specifically, the narrowness of the prior art's airflow plenums 126 cause flow separation at locations near the upstream faces 110a, 112a, 114a, 116a of the cabinets wherever the airflow cannot negotiate a tight turn around a sharp edge. In the wake of such separation is a stagnation region of very-low-velocity airflow that causes very high temperatures of the electronics 134 therein. The tendency to separate may be minimized by widening the prior-art combined plenums 126, but this is highly undesirable in the prior art, because of the desire to achieve a compact footprint of the row 108 of cabinets and plenums, and because of the aforementioned requirement to match the periodicity of the holes 154 with the pitch p of the removable tiles 146. In contrast, embodiments 400 and 500 of the current invention require no air turn upstream of any electronics 134, so the problem of flow separation is completely eliminated. All other embodiments require just one air turn per row 220, upstream of the first cabinet 110. Because the invention has only one intake plenum per row 220 rather than one intake plenum per cabinet as in the prior art, beneficial widening of the intake plenum, mentioned above, has, for the invention, much less impact on the footprint of a row 220 than a similar widening would have for the prior-art row 108. That is, widening each of the prior-art's inlet plenums (118 and 128) by an amount d widens the prior-art cabinet row 108 by an amount Nd, where N is the number of cabinets per row. In contrast, widening the invention's intake end plenum (222 or 622, depending on the embodiment) by the same amount d widens the invention's flow-through row 220 merely by d, a factor-of-N improvement over the prior art.

Fifth, the prior art's need to turn the air twice in each cabinet 110, 112, 114, 116 is eliminated by the invention. By replacing the prior-art's S-shaped air-streams 138, with the single, row-wise airflow path 218 most or all of the air turns are eliminated. Specifically, instead of two 90-degree turns per cabinet in the prior-art apparatus 100, there are only four turns per row in apparatuses 200, 700, 800, and 900; only two turns per row in apparatuses 300 and 600; only one turn per row in apparatus 400; and zero turns per row in apparatus 500. Fewer turns is desirable because turning air incurs pressure drop and thereby reduces airflow, raising the temperature, shortening the life and compromising the performance of the electronics 134.

Sixth, compared to the prior art, the invention provides additional space for air-moving devices. As shown by apparatus 700 in FIG. 7, an air-to-water heat exchanger specified by this invention, such as 210, need not occupy the entire space between the adjacent cabinets 110 and 112; instead, some of this space may be occupied by the array of air-moving devices 760, which either supplement or replace the air-moving devices 136 internal to cabinet 110. If air-moving devices 760, 762, 764, 766 supplement air-moving devices 136, then the pressure rise of the system (and hence the air velocity) is greatly increased, a benefit that may be used either to reduce the temperature of the electronics, or to cool more electronics or more powerful electronics. If, instead, the air-moving devices 760, 762, 764, 766 replace air-moving devices 136, then the space vacated by 136 may beneficially be used to house more electronics 134 in cabinet 110.

Seventh, the periodic, large airflow holes 154 in the raised floor 142 of the prior-art apparatus 100 are eliminated by this invention, thereby reducing the system's dependence on the pitch p of removable tiles 146 of the raised floor 142. For example, in apparatus 200 shown in FIG. 2, pitch C of cabinets along a row, defined as $C \equiv x_8-x_6 \equiv x_6-x_4 \equiv x_4-x_2 \equiv x_2-x_0$, is substantially unconstrained by the pitch p of the raised-floor tiles 95, because the only holes therein are small holes for the supply and return pipes 240 and 242. However, in the prior art, the holes 154 are large, and thus it is more important that the cabinet pitch C and the tile pitch p be more closely synchronized, to avoid interfering with struts that support the raised floor 142. Toward this end, in the prior art, C and p are preferably related by a simple proportion such as mC=np where m and n are small integer such as (m, n)=(1, 2) or (m, n)=(2, 3). No such restriction applies to the invention.

Eighth, redundancy of the air-moving devices 136 is improved by the invention vis-à-vis the prior art. Specifically, along a flow-through row of cabinets 220, air-moving devices 136 sharing a common streamline back each other up, such that failure of a single air-moving device 136 is much less significant than for the prior-art's separate, S-shaped airstreams 138, wherein failure of an air-moving device can cause the temperature of nearby electronics to rise. For apparatus 700, similar redundancy is achieved for the supplementary, or alternative, series of air movers 762, 764, 766, 768.

Ninth, the invention improves cabinet-packing density vis-à-vis the prior art, thereby saving valuable floor space and also improving electrical-signaling performance between cabinets by allowing shorter cables. Specifically, the stream-wise (x) dimension of one of the heat exchangers assemblies 210, 212, 214, 216 is typically far smaller than the x dimension of one of the prior art's combined plenum units 126, because the heat-exchanger's x dimension need only be large enough to accommodate tubes and fins to transfer heat from air to water, whereas the combined plenum unit's x dimension must be large enough to accommodate, through the intake plenum 128 and the exhaust plenum 130, the large volumetric flow-rate of air, denoted V, that is needed to cool electronics 134. For example, in the IBM® BlueGene/P® supercomputer, which comprises electronics 134 in each cabinet dissipating as much as 40 kW, and whose (x, y, z) cabinet dimensions are (70 cm, 89 cm, 180 cm), the x dimension of one of the heat exchangers 210, 212, 214, 216 need only be 10 cm, whereas the x dimension of the combined plenum unit 126 must be 52 cm in order to accommodate V=2.35 m3/s (5000 CFM). Thus, cooling BlueGene/P according to the current invention saves about 42 cm of width per cabinet, which is about 47% of the width of the cabinet itself.

Thereby, the present invention clearly is advantageous for at least the reasons above in use with a supercomputer requiring rows of cabinets such as IBM®'s BLUEGENE®, by the single stream of air flowing through a row of cabinets, passing alternately through cabinets and heat exchangers, instead of flowing air separately through each cabinet.

While the present invention has been particularly shown and described with respect to preferred embodiments thereof, it will be understood by those skilled in the art that changes in forms and details may be made without departing from the spirit and scope of the present application. It is therefore intended that the present invention not be limited to the exact forms and details described and illustrated herein, but falls within the scope of the appended claims.

What is claimed is:

1. A cooling apparatus, comprising:
    a plurality of cabinets positioned on a raised floor in an enclosed room and arranged in sequence in a row with the cabinets spaced apart from each other;
    a plurality of heat-producing electronic devices positioned in the plurality of cabinets for allowing a flow of a first fluid through the cabinets and the heat producing electronic devices to cool the heat producing electronic devices;
    a first plenum positioned at a beginning of said row, at an upstream side of a first cabinet of the row of the cabinets, for directing the first fluid into and through the row of the cabinets;
    a plurality of heat exchangers abutting the cabinets in the row of the cabinets, with the cabinets and the heat exchangers alternating in the row, each heat exchanger for conducting a second fluid therethrough for cooling the first fluid; and
    a second plenum positioned at an end of the row of the cabinets, at a downstream side of a last cabinet of the row of the cabinets, for receiving the first fluid from the row of the cabinets and conducting the first fluid from the last cabinet and into a channel between the raised floor and a sub-floor to conduct the first fluid, beneath the row of the cabinets, to the upstream side of the first cabinet of the row of the cabinets, wherein the first fluid is conducted into the first plenum from said channel at a temperature $T_0$;
    wherein the plurality of cabinets, the plurality of heat exchangers, the first plenum, the second plenum, and the channel between the raised floor and the sub-floor conduct the first fluid to, through, and from the row of the cabinets in a closed fluid loop to reduce airflow and associated acoustical noise in the enclosed room; and
    wherein in said row of the cabinets, each of the heat exchangers is immediately downstream of a respective one of the cabinets, and in each cabinet-heat exchanger pair, comprised of one of the cabinets and the one of the heat exchangers immediately downstream of said one of the cabinets, the one of the cabinets increases the temperature of the first fluid and the one of the heat exchangers reduces the temperature of the first fluid to $T_0$, and each cabinet-heat exchanger pair is thermally neutral for the first fluid for returning the first fluid into, and conducting the first fluid through, said channel at the reduced temperature $T_0$ such that the temperature of the first fluid in the closed loop floats to an equilibrium state and the heat producing electronic devices put no thermal lead on the enclosed room.

2. The cooling apparatus according to claim 1, wherein in the equilibrium state, the temperature of the first fluid varies between $T_0$ and a higher temperature $T_1$.

3. The cooling apparatus according to claim 1, wherein the first fluid is air.

4. The apparatus according to claim 1, wherein:
the first fluid is air;
said closed loop is a closed air path;
the first fluid enters a first of the cabinets in said sequence at the temperature $T_0$; and
the first fluid exits a last of the heat exchangers in said row at the temperature $T_0$.

5. The cooling apparatus according to claim 1, wherein the plurality of cabinets are arranged in the sequence in a single, straight row;
the first plenum includes an intake end wall slanting upwardly inwardly toward a top end of the first cabinet for guiding the direction of the first fluid upwardly and into the first cabinet;
the second plenum includes an exhaust end wall slanting downwardly outwardly away from the last cabinet for guiding the direction of the first fluid downwardly from the last cabinet;
the apparatus further comprises a plurality of fluid-moving devices adjacent the heat-producing devices for encouraging flow of the first fluid through the cabinets, the heat-producing devices, and the heat exchangers, thereby encouraging heat transfer from the first fluid to a second fluid in each of the heat exchangers; and
the first plenum and the fluid moving devices direct the first fluid in a single, row-wise airflow path that travels substantially straight through the entire row of the heat-producing devices, from the first plenum to the second plenum, to circulate the first fluid through the closed loop.

6. The cooling apparatus according to claim 1, wherein in said row of the cabinets, each of the cabinets is immediately upstream of a respective one of the heat exchangers.

7. The cooling apparatus according to claim 6, wherein the heat producing electronic devices and the heat exchangers alternately raise and lower the temperature of the first fluid in said equilibrium state.

8. The cooling apparatus according to claim 7, wherein the heat producing electronic devices and the heat exchangers alternately raise and lower the temperature of the first fluid between $T_0$ and a higher temperature $T_1$.

9. The cooling apparatus according to claim 6, wherein:
the directing a flow of a first fluid through the heat-producing electronic devices, the cabinets, and the heat exchangers includes conducting the first fluid in sequence through each of the cabinets and from each of the cabinets, to the one of the heat exchangers immediately downstream of said each cabinet; and
as the first fluid flows through each of the cabinets, the heat producing electronic devices in said each cabinet raise the temperature of the first fluid to a temperature above said temperature $T_0$.

10. The cooling apparatus according to claim 9, wherein:
each of the heat exchangers lowers the temperature of the first fluid, conducted to the each heat exchanger from the one of the cabinets immediately upstream of each heat exchanger, to maintain the temperature of the first fluid floats in said equilibrium state.

11. The cooling apparatus according to claim 10, wherein:
each of the heat exchangers lowers the temperature of the first fluid, conducted to the each heat exchanger from the one of the cabinets immediately upstream of each heat exchanger, to said temperature $T_0$.

12. A cooling system in an enclosed room, comprising:
a plurality of cabinets arranged in sequence in a row with the cabinets spaced apart from each other;
a plurality of heat-producing electronic devices positioned in the plurality of cabinets for allowing a flow of a first fluid through the cabinets and the heat producing devices to cool the heat producing devices;
a raised floor in the enclosed room and supporting the plurality of cabinets, wherein a channel is defined between the raised floor and a sub-floor to conduct the first fluid from a downstream side of the cabinets to an upstream side of the cabinets;
a first plenum positioned at a beginning of the row of the cabinets, at an upstream side of a first cabinet of the row of the cabinets, for directing the flow of the first fluid into and through the row of the cabinets;
a plurality of heat exchangers abutting the cabinets in said row of the cabinets, with the cabinets and the heat exchangers alternating in the row, each heat exchanger for conducting a second fluid therethrough for cooling the first fluid; and
a second plenum positioned at an end of said row of the cabinets, adjacent a downstream side of a last cabinet of the row of the cabinets, for receiving the first fluid from the row of the cabinets and conducting the first fluid from the last cabinet and into the channel defined by the raised floor and the sub-floor to conduct the first fluid, beneath the row of the cabinets, to the upstream side of the first cabinet of the row of the cabinets, wherein the first fluid is conducted into the first plenum from said channel at a temperature $T_0$;
wherein the plurality of cabinets, the plurality of heat exchangers, the first plenum, the second plenum, and the channel between the raised floor and the sub-floor conduct the first fluid to, through, and from the row of the cabinets in a closed fluid loop to reduce airflow and associated acoustical noise in the enclosed room; and
wherein in said row of the cabinets, each of the heat exchangers is immediately downstream of a respective one of the cabinets, and in each cabinet-heat exchanger pair, comprised of one of the cabinets and the one of the heat exchangers immediately downstream of said one of the cabinets, the one of the cabinets increases the temperature of the first fluid and the one of the heat exchangers reduces the temperature of the first fluid to $T_0$, and each cabinet-heat exchanger pair is thermally neutral for the first fluid for returning the first fluid into, and conducting the first fluid through, said channel at the reduced temperature $T_0$ such that the temperature of the first fluid in the closed loop floats to an equilibrium state and the heat producing electronic devices put no thermal load on the enclosed room.

13. The cooling system of claim 12, wherein each of the heat exchangers provides, at the downstream side of said each heat exchanger, a temperature of the first fluid that is substantially the same as the temperature of the first fluid when entering the upstream side of the first cabinet.

14. The cooling system according to claim 12, wherein in said row of cabinets, each of the cabinets is immediately upstream of a respective one of the heat exchangers.

15. The cooling apparatus according to claim 14, wherein:
the directing a flow of a first fluid through the heat-producing electronic devices, the cabinets, and the heat exchangers includes conducting the first fluid in sequence through each of the cabinets and from each of the cabinets, to the one of the heat exchangers immediately downstream of said each cabinet;
as the first fluid flows through each of the cabinets, the heat producing electronic devices in said each cabinet raise the temperature of the first fluid to a temperature above said temperature $T_0$; and
each of the heat exchangers lowers the temperature of the first fluid, conducted to the each heat exchanger from the one of the cabinets immediately upstream of each heat exchanger, to maintain the temperature of the first fluid floats in said equilibrium state.

16. The cooling system according to claim 14, wherein the heat producing electronic devices and the heat exchangers alternately raise and lower the temperature of the first fluid in said equilibrium state.

17. A method for cooling, comprising:
positioning a plurality of cabinets on a raised floor in an enclosed room, with the plurality of cabinets arranged in sequence in a row with the cabinets spaced apart from each other;
positioning a plurality of heat-producing electronic devices in the plurality of cabinets;
directing a flow of a first fluid through the cabinets and the heat-producing electronic devices to cool the heat producing electronic devices, including positioning a first plenum at a beginning of said row of the cabinets, at an upstream side of a first cabinet of the row of the cabinets for directing the first fluid into and through the row of the cabinets;
positioning a plurality of heat exchangers abutting the cabinets in said row of the cabinets, with the cabinets and the heat exchangers alternating in the row, for cooling the first fluid;
directing the first fluid from the row of the cabinets into a channel defined between the raised floor and a sub-floor to conduct the first fluid, beneath the row of the cabinets, to the upstream side of the first cabinet of the row of the cabinets, including positioning a second plenum at an end of said row of the cabinets, at a downstream side of a last cabinet of the row of the cabinets, for receiving the first fluid from the row of the cabinets and conducting the first fluid into said channel, wherein the first fluid is conducted into the first plenum from said channel at a temperature $T_0$, and wherein the plurality of cabinets, the plurality of heat exchangers, the first plenum, the second plenum, and the channel between the raised floor and the sub-floor conduct the first fluid to, through, and from the row of the cabinets in a closed fluid loop to reduce airflow and associated acoustical noise in the enclosed room; and
wherein in said row of the cabinets, each of the heat exchangers is immediately downstream of a respective one of the cabinets, and in each cabinet-heat exchanger pair, comprised of one of the cabinets and the one of the heat exchangers immediately downstream of said one of the cabinets, the one of the cabinets increases the temperature of the first fluid and the one of the heat exchangers reduces the temperature of the first fluid to $T_0$, and each cabinet-heat exchanger pair is thermally neutral for the first fluid for returning the first fluid into, and conducting the first fluid through, said channel at the reduced temperature $T_0$ such that the temperature of the first fluid in the closed loop floats to an equilibrium state and the heat producing electronic devices put no thermal load on the enclosed room.

18. The method according to claim 17, wherein the positioning a plurality of heat exchangers adjacent to the cabinets includes using each of the plurality of heat exchangers to cool the first fluid to the temperature $T_0$ to return the first fluid to the channel at the same temperature at which the first fluid is discharged from said channel.

19. The method according to claim 18, wherein in said row of cabinets, each of the cabinets is immediately upstream of a respective one of the heat exchangers.

20. The method according to claim 19, wherein:
the directing a flow of a first fluid through the heat-producing electronic devices, the cabinets, and the heat exchangers includes conducting the first fluid in sequence through each of the cabinets and from each of the cabinets, to the one of the heat exchangers immediately downstream of said each cabinet; and
as the first fluid flows through each of the cabinets, the heat producing electronic devices in said each cabinet raise the temperature of the first fluid to a higher temperature above said temperature $T_0$.

* * * * *